(12) United States Patent
Inano et al.

(10) Patent No.: US 10,993,354 B2
(45) Date of Patent: Apr. 27, 2021

(54) DATA CENTER SYSTEM, CONTROL METHOD OF DATA CENTER SYSTEM, AND RECORDING MEDIUM RECORDING CONTROL PROGRAM OF DATA CENTER SYSTEM

(71) Applicant: FUJITSU LIMITED, Kawasaki (JP)

(72) Inventors: Satoshi Inano, Minoh (JP); Hiroyoshi Kodama, Isehara (JP); Shigeto Suzuki, Kawasaki (JP); Toshio Sugimoto, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/247,684

(22) Filed: Jan. 15, 2019

(65) Prior Publication Data
US 2019/0150327 A1 May 16, 2019

Related U.S. Application Data

(63) Continuation of application No. 15/340,392, filed on Nov. 1, 2016, now abandoned.

(30) Foreign Application Priority Data

Nov. 5, 2015 (JP) .................................. 2015-217880

(51) Int. Cl.
H05K 7/20 (2006.01)
G05B 13/02 (2006.01)

(52) U.S. Cl.
CPC ....... *H05K 7/20836* (2013.01); *H05K 7/2079* (2013.01); *H05K 7/20745* (2013.01); *H05K 7/20827* (2013.01); *G05B 13/02* (2013.01)

(58) Field of Classification Search
CPC ............. H05K 7/20745; H05K 7/2079; H05K 7/20827; H05K 7/20836; G05B 13/02
See application file for complete search history.

(56) References Cited

U.S. PATENT DOCUMENTS 6,813,897 B1 * 11/2004 Bash ...................... G06F 1/206
62/175
7,436,666 B1 10/2008 Konshak
(Continued)

FOREIGN PATENT DOCUMENTS

CA 2731994 A1 * 2/2010 ......... H05K 7/20763
GB 2477739 8/2011
(Continued)

OTHER PUBLICATIONS

Japanese Office Action dated Apr. 23, 2019 for corresponding Japanese Patent Application No. 2015-217880 with English Translation, 9 pages.
(Continued)

*Primary Examiner* — Jennifer L Norton
(74) *Attorney, Agent, or Firm* — Fujitsu Patent Center

(57) ABSTRACT

A data center system includes: a data center including an electronic device and an air conditioner configured to cool the electronic device; a cooling device including a first cooler configured to cool cooling water to be supplied to the data center by an air blow and a second cooler configured to cool the cooling water by heat exchange; and a control device configured to control the cooling device, wherein the control device is configured to: acquire outside temperature information from a temperature sensor provided outside the data center; calculate cooling water temperature information to be set to the cooling device by adding a cooling temperature difference based on a cooling ability of the first cooler to the outside temperature information; and set the cooling water temperature information to the cooling device.

16 Claims, 14 Drawing Sheets

(56) References Cited

U.S. PATENT DOCUMENTS

| | | | | |
|---|---|---|---|---|
| 8,295,047 | B1 * | 10/2012 | Hamburgen | H05K 7/20827 361/699 |
| 8,701,429 | B2 * | 4/2014 | Oki | F24F 5/0035 62/181 |
| 9,563,216 | B1 | 2/2017 | Barroso | |
| 9,723,762 | B1 | 8/2017 | Ross | |
| 9,784,460 | B2 | 10/2017 | Magcale | |
| 9,949,410 | B1 * | 4/2018 | Kowalski | H05K 7/20745 |
| 9,949,411 | B2 | 4/2018 | Belady | |
| 9,952,103 | B2 | 4/2018 | VanGilder | |
| 9,968,011 | B2 | 5/2018 | Shabbir | |
| 9,970,670 | B2 | 5/2018 | Carlson | |
| 2007/0032979 | A1 * | 2/2007 | Hamann | G01K 1/026 702/130 |
| 2008/0204999 | A1 | 8/2008 | Clidaras | |
| 2009/0301123 | A1 | 12/2009 | Monk | |
| 2012/0103591 | A1 | 5/2012 | Tozer | |
| 2012/0123595 | A1 | 5/2012 | Bower, III et al. | |
| 2013/0190899 | A1 | 7/2013 | Slessman | |
| 2014/0049905 | A1 | 2/2014 | Manzer | |
| 2014/0053588 | A1 | 2/2014 | Karrat | |
| 2014/0060798 | A1 | 3/2014 | Eckberg | |
| 2014/0074444 | A1 | 3/2014 | Hamann et al. | |
| 2016/0138840 | A1 * | 5/2016 | Borror | F25B 23/006 62/150 |
| 2016/0192542 | A1 * | 6/2016 | LeFebvre | H05K 7/20827 361/679.47 |
| 2017/0231118 | A1 * | 8/2017 | Cader | H05K 7/1497 |
| 2017/0241658 | A1 * | 8/2017 | Salsbury | F24F 11/77 |
| 2017/0295667 | A1 * | 10/2017 | Cader | H05K 7/20254 |
| 2017/0303443 | A1 | 10/2017 | Inano | |
| 2018/0035568 | A1 * | 2/2018 | Ahdoot | H05K 7/20827 |
| 2018/0063999 | A1 | 3/2018 | Matsuyama | |
| 2019/0159365 | A1 * | 5/2019 | Snip | E04B 5/48 |
| 2019/0383538 | A1 * | 12/2019 | Kopko | F25B 40/04 |
| 2020/0015389 | A1 * | 1/2020 | Gao | H05K 7/20745 |
| 2020/0163251 | A1 * | 5/2020 | Chopra | H05K 7/2079 |
| 2020/0393153 | A1 * | 12/2020 | Grabon | F24F 11/0001 |

FOREIGN PATENT DOCUMENTS

| | | | | |
|---|---|---|---|---|
| JP | 2012-47386 A | | 3/2012 | |
| JP | 2012-237468 A | | 12/2012 | |
| JP | 2014-129937 | | 7/2014 | |
| JP | 2014-202410 A | | 10/2014 | |
| WO | WO-2005057097 A3 * | 8/2005 | | F25B 23/006 |
| WO | WO-2006137091 A1 * | 12/2006 | | H05K 7/2079 |
| WO | WO-2018186933 A1 * | 10/2018 | | H05K 7/1489 |
| WO | WO-2018209394 A1 * | 11/2018 | | H05K 7/20836 |
| WO | WO-2020035471 A1 * | 2/2020 | | H05K 7/20745 |

OTHER PUBLICATIONS

USPTO, (NORTON) Notice of Non-Compliant Amendment, dated Dec. 4, 2018, in parent U.S. Appl. No. 15/340,392 [pending].

USPTO, (NORTON) Non-Final Rejection, dated Jun. 18, 2018, in parent U.S. Appl. No. 15/340,392 [pending].

USPTO, (NORTON) Non-Final Rejection, dated Jan. 16, 2018, in parent U.S. Appl. No. 15/340,392 [pending].

Japanese Office Action dated Nov. 5, 2019 for corresponding Japanese Patent Application No. 2015-217880, with English Translation, 13 pages.

* cited by examiner

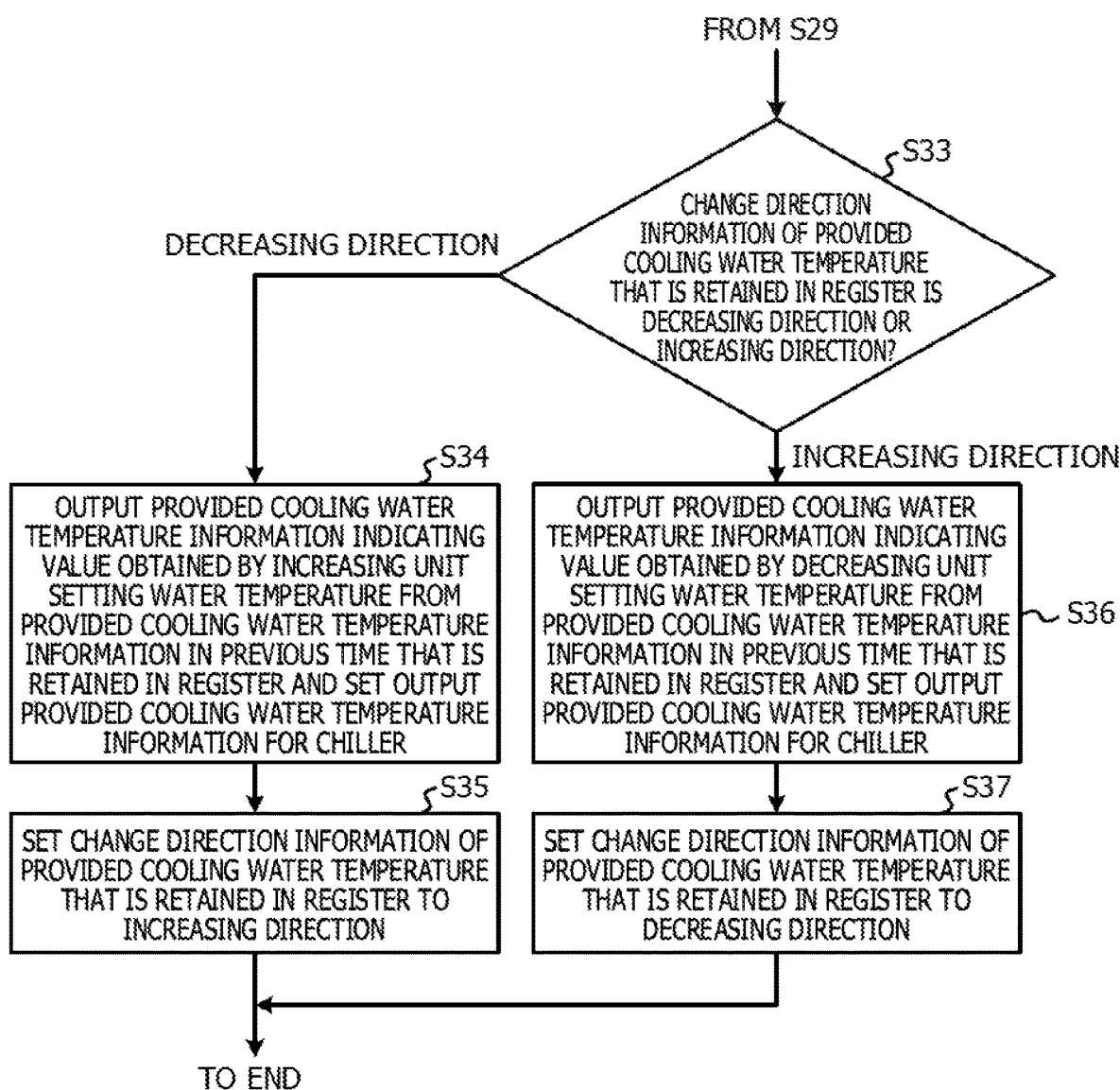

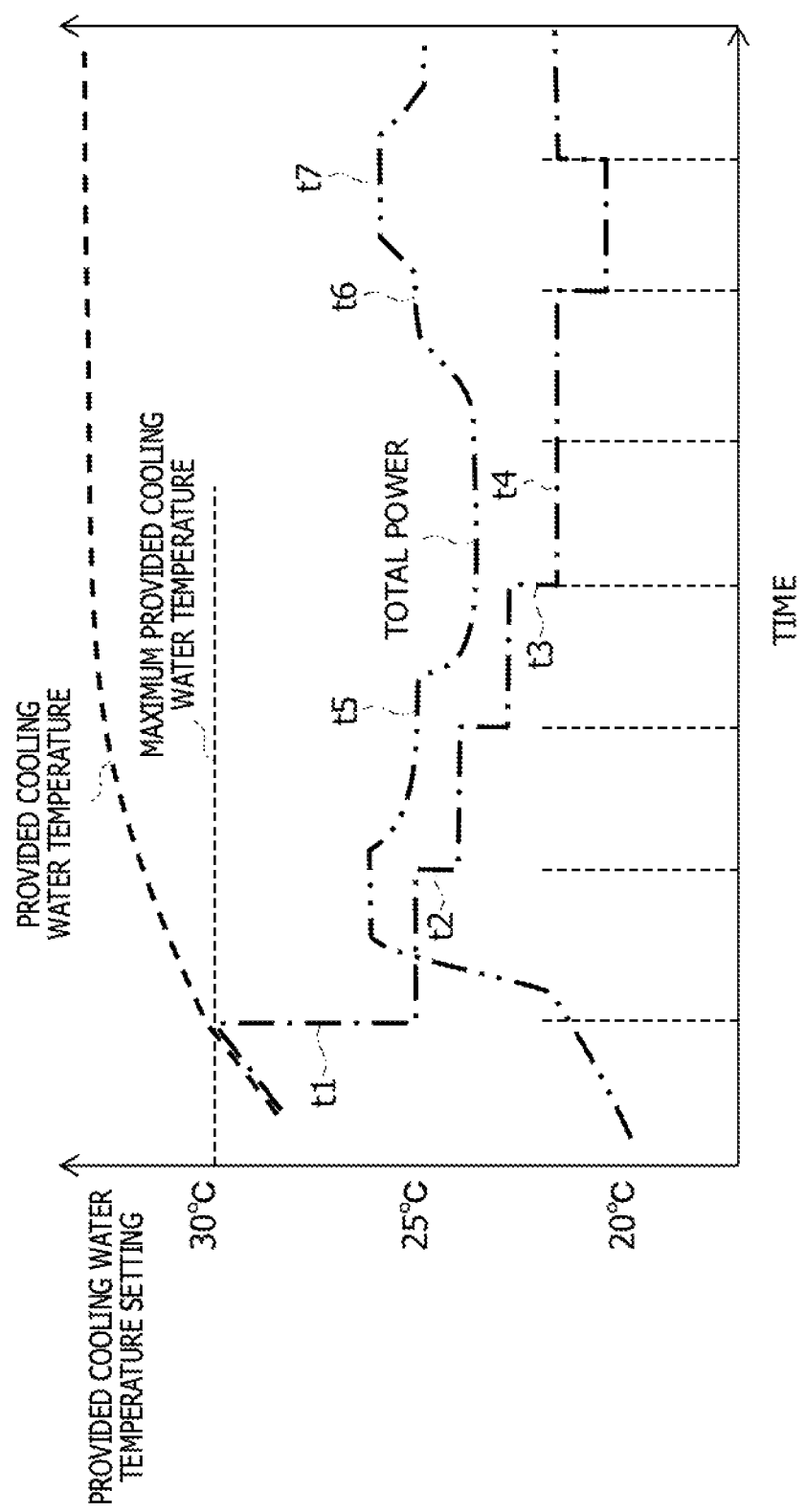

DATA CENTER SYSTEM, CONTROL METHOD OF DATA CENTER SYSTEM, AND RECORDING MEDIUM RECORDING CONTROL PROGRAM OF DATA CENTER SYSTEM

CROSS-REFERENCE TO RELATED APPLICATION

This application is a continuation of application Ser. No. 15/340,392, filed Nov. 1, 2016, which is based upon and claims the benefit of priority of the prior Japanese Patent Application No. 2015-217880, filed on Nov. 5, 2015, the entire contents of which are incorporated herein by reference.

FIELD

The embodiment discussed herein is related to a data center system, a control method of a data center system, and a recording medium recording a control program of a data center system.

BACKGROUND

An inside of a data center is cooled to a regular temperature for which a sufficient temperature margin is secured for an operation temperature specification of an information and communication technology (ICT) apparatus such as a server.

An example of related art is disclosed in Japanese Laid-open Patent Publication No. 2014-129937.

SUMMARY

According to an aspect of the embodiments, a data center system includes: a data center including an electronic device and an air conditioner configured to cool the electronic device; a cooling device including a first cooler configured to cool cooling water to be supplied to the data center by an air blow and a second cooler configured to cool the cooling water by heat exchange; and a control device configured to control the cooling device, wherein the control device is configured to: acquire outside temperature information from a temperature sensor provided outside the data center; calculate cooling water temperature information to be set to the cooling device by adding a cooling temperature difference based on a cooling ability of the first cooler to the outside temperature information; and set the cooling water temperature information to the cooling device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 7A to 7C illustrate one example of the setting process of the cooling water temperature;
FIG. 8 illustrates one example of total power.

DESCRIPTION OF EMBODIMENT

For example, a relatively large temperature margin is set in order to perform cooling while priority is given to stable operation of a server or the like.

For example, in a data center of an indirect air conditioning type, cooling water at a regular temperature, which is produced by an outdoor chiller, circulates in an air conditioning unit of the data center. The chiller has a free cooling unit that cools the cooling water by free cooling and a cooling compressor that cools the cooling water by heat exchange. The air conditioning unit controls an air flow amount or the like of an air blowing fan of the air conditioning unit such that the temperature detected by a temperature sensor provided in the data center and the temperature detected by a temperature sensor provided in an outlet portion of the air conditioning unit, for example, become regular set temperatures. The chiller causes the cooling compressor to operate and maintains the cooling water at a regular temperature in a case where the outside air wet-bulb temperature rises and the heat discharge efficiency of the free cooling unit significantly decreases due to the relationship between the outside air wet-bulb temperature and the set temperature. The power consumption of the cooling compressor is high compared to the power consumption of the free cooling unit. Thus, the chiller requests more power for heat discharge as the time of operation of the cooling compressor becomes longer.

For example, in the data center of the indirect air conditioning type, the cooling water produced by the chiller is continuously maintained at a regular temperature. Thus, the power consumption of the chiller increases as the outside air wet-bulb temperature rises and the operation time of the cooling compressor becomes longer due to the relationship between the outside air wet-bulb temperature and the set temperature. It may be difficult to reduce the power consumption of a whole data center system.

A data center system of the present disclosure has a cooling device that includes a first cooling unit which cools cooling water to be supplied to a data center by free cooling and a second cooling unit which cools the cooling water by heat exchange and a control device that control the cooling device. The control device includes a temperature information acquisition unit that acquires outside temperature information of the data center, a calculation unit that adds a cooling temperature difference based on a cooling ability of the first cooling unit to the outside temperature information and thereby calculates a provided cooling water temperature information which is set for the cooling device, and a setting unit that sets the provided cooling water temperature information for the cooling device.

Figure 1:
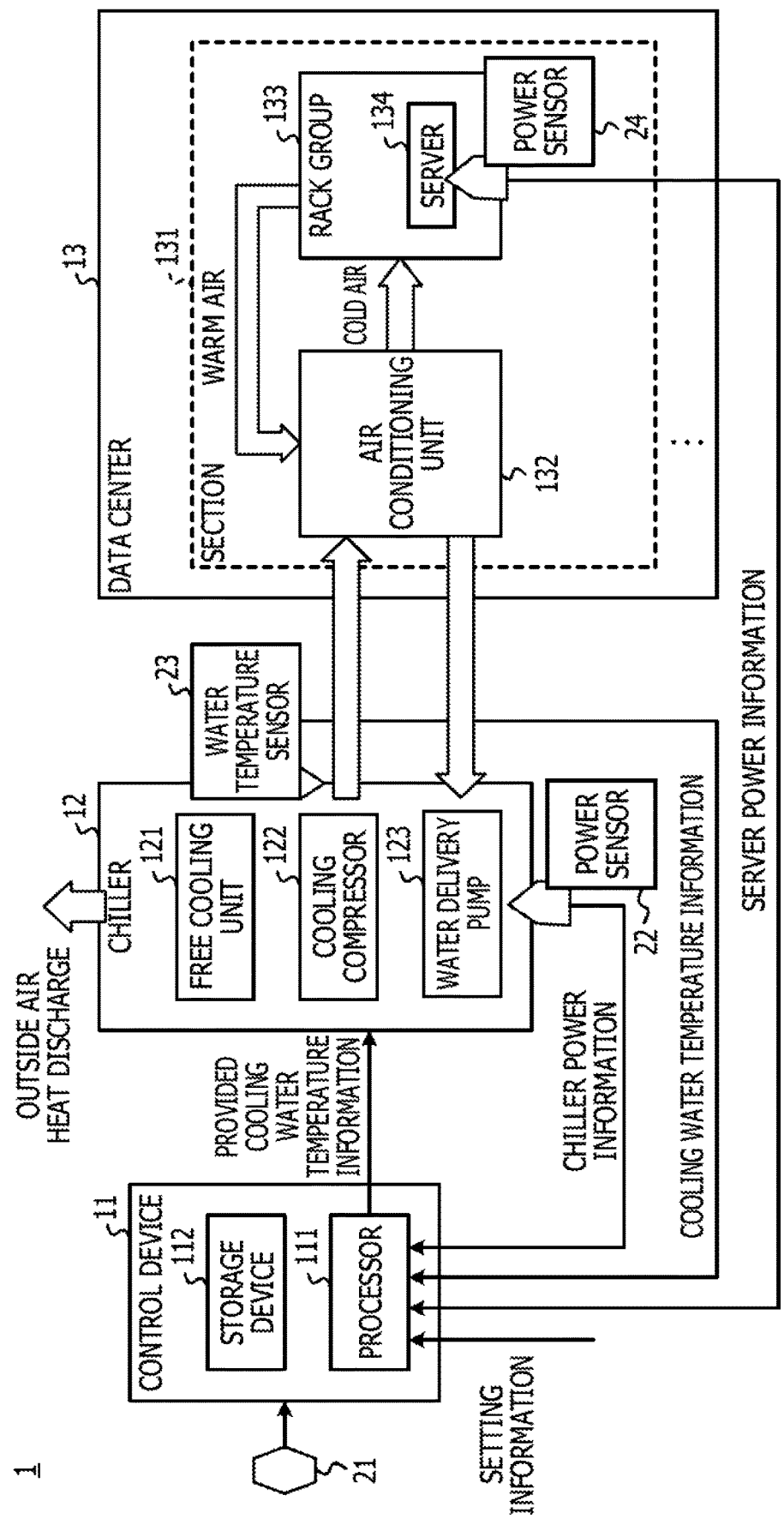
FIG. 1 illustrates one example of a data center system.

FIG. 1 illustrates one example of the data center system. A data center system 1 illustrated in FIG. 1 has a control device 11, a chiller 12, and a data center 13. The control device 11 and the chiller 12 are provided in an outdoor place. A temperature sensor 21 is arranged in a position in which the outside air wet-bulb temperature is detectable and inputs detected outside air wet-bulb temperature information to the control device 11. Outside air wet-bulb temperature information may be one example of outside temperature information of the data center 13. A power sensor 22 detects the power consumption of the chiller 12 and inputs detected chiller power information to the control device 11. A water temperature sensor 23 may be one example of a temperature sensor that is arranged in a position in which the temperature of cooling water (hereinafter referred to as "cooling water temperature") produced by the chiller 12 is detectable and that inputs detected cooling water temperature information to the control device 11.

The control device 11 may include a general-purpose computer, for example, and may include a processor 111 such as a central processing unit (CPU) and a storage device 112 such as a memory, for example. The processor 111 executes a program that is stored in the storage device 112 and thereby performs a setting process of the cooling water temperature for setting the cooling water temperature for the chiller 12. The processor 111 outputs provided cooling water temperature information for controlling the chiller 12 based on setting information described later, the cooling water temperature information from the water temperature sensor 23, the chiller power information from the power sensor 22, and server power information from a power sensor 24. The setting information may be information that is in advance set as default. The storage device 112 stores various kinds of data such as parameters that are used by the program and intermediate results of a computation process that is executed by the processor 111, in addition to the program that is executed by the processor 111.

The chiller 12 may be one example of the cooling device and may include a free cooling unit 121, a cooling compressor 122, and a water delivery pump 123, for example. The free cooling unit 121 may be one example of a first air cooling unit that cools the cooling water by an air blow (hereinafter referred to as "free cooling" also). The free cooling unit 121 may be a cooling tower or the like that includes a cooling air blowing unit or the like. A cooling tower in related art may be used. The cooling compressor 122 may be one example of the second air cooling unit that cools the cooling water by heat exchange. The cooling compressor 122 may be a compressor that includes a heat exchanger, a heat discharging air blowing unit, and so forth. A compressor in related art may be used. The power consumption of the cooling compressor 122 may be high compared to the power consumption of the free cooling unit 121. The cooling water that is produced by the free cooling unit 121 and the cooling compressor 122 is supplied to an air conditioning unit 132 in the data center 13. The cooling water temperature of the cooling water that is produced by the chiller 12 and supplied to the air conditioning unit 132 is controlled based on the provided cooling water temperature information that is input from the control device 11 to the chiller 12. The water delivery pump 123 returns the cooling water that is returned from the data center 13 to the free cooling unit 121 and the cooling compressor 122. A configuration for the return may be a configuration in related art.

The data center 13 has plural sections 131, and each of the sections 131 includes an air conditioning unit 132 and a rack group 133. The air conditioning unit 132 may include an air blowing fan, the heat exchanger, and a control unit or the like that controls the air conditioning unit 132, for example. A control unit in related art may be used as the control unit. The rack group 133 has plural racks, and each of the racks is provided with one or plural servers 134. The server 134 may be one example of an electronic device such as an ICT apparatus. Cold air that is sent out from the air conditioning unit 132 is supplied to the rack group 133 and cools the servers 134 in the rack group 133. The temperature of the cold air in the section 131 rises in accordance with heat generation by the servers 134 in the rack group 133, for example, and the air becomes warm air and circulates in the air conditioning unit 132. The cooling water whose temperature rises due to the warm air is circulated by the water delivery pump 123 and supplied from the air conditioning unit 132 to the chiller 12. The power sensor 24 detects the power consumption of the servers 134 in the rack group 133 and inputs detected server power information to the control device 11.

Figure 2:
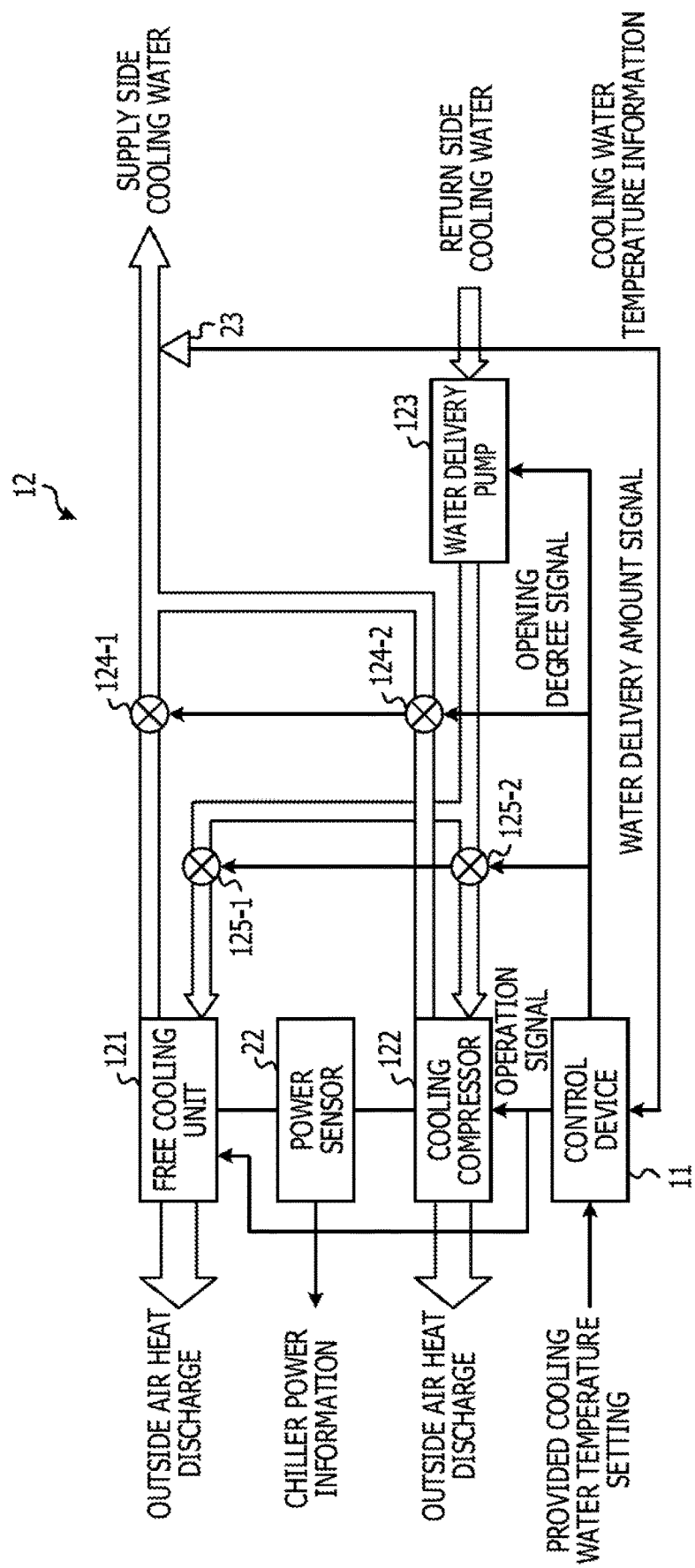
FIG. 2 illustrates examples of a cooling device and a control device.

FIG. 2 illustrates examples of the cooling device and the control device. The chiller 12, which is one example of the cooling device, includes a valve 124-1 provided on a sending side of the free cooling unit 121, a valve 124-2 provided on a sending side of the cooling compressor 122, a valve 125-1 provided on an input side of the free cooling unit 121, and a valve 125-2 provided on an input side of the cooling compressor 122. The free cooling unit 121 and the cooling compressor 122 operate in response to operation signals from the control device 11. The cooling water that is supplied from the free cooling unit 121 and the cooling compressor 122 is supplied to the air conditioning unit 132 via the valves 124-1 and 124-2 whose opening degrees are controlled by opening degree signals from the control device 11. The cooling water supplied to the air conditioning unit 132 are returned toward the chiller 12 by the water deliver pump 123 whose water delivery amount is controlled by a water delivery amount signal from the control device 11. For example, the cooling water from the water delivery pump 123 is returned to the free cooling unit 121 and the cooling compressor 122 via the valves 125-1 and 125-2, whose opening degrees are controlled by opening degree signals from the control device 11, by the water deliver pump 123, and circulates in the chiller 12.

Figure 3:
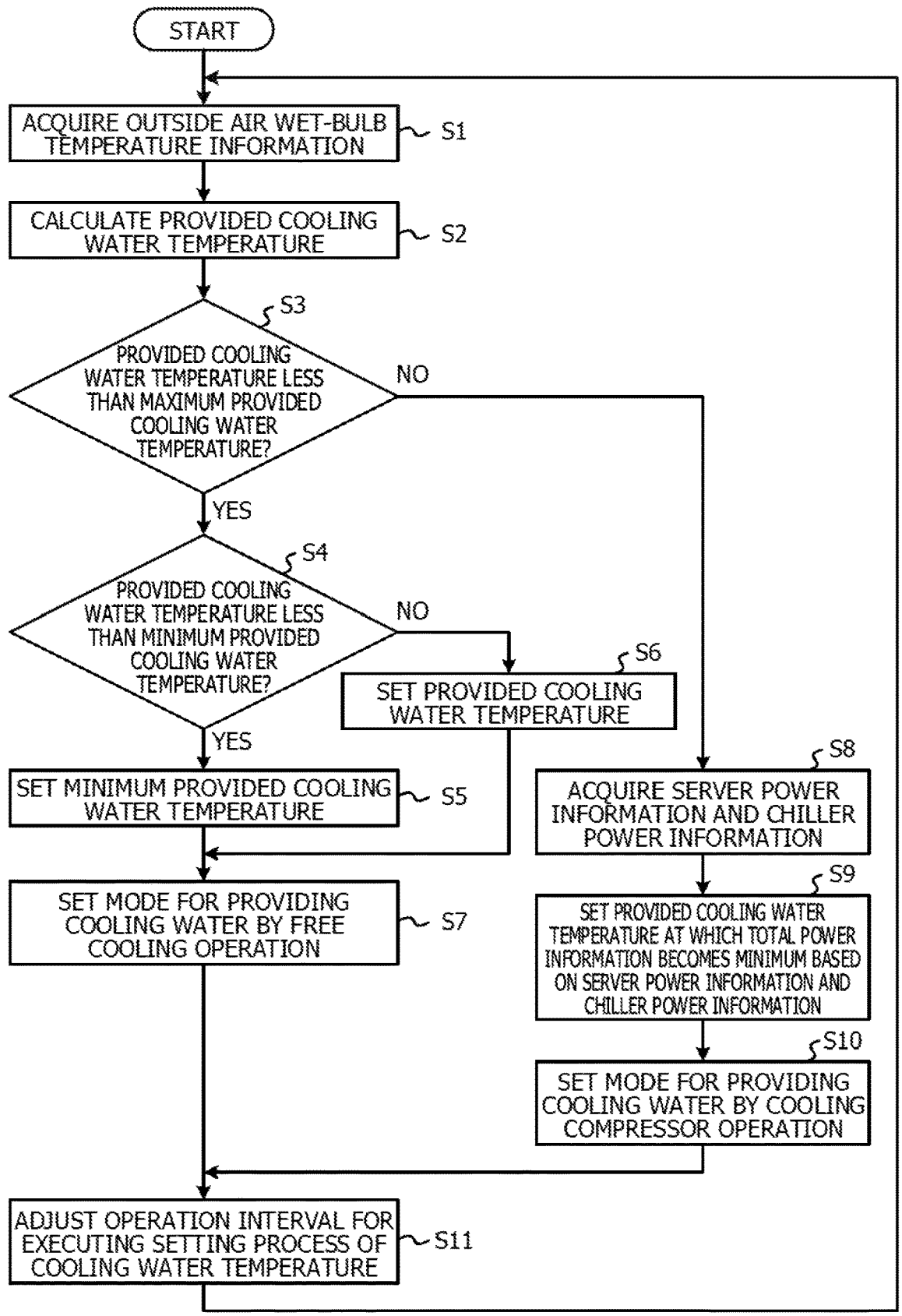
FIG. 3 illustrates one example of a setting process of a cooling water temperature.

FIG. 3 illustrates one example of the setting process of the cooling water temperature. The setting process illustrated in FIG. 3 may be executed by the processor 111. When the setting process of the cooling water temperature is started, in operation S1, the processor 111 acquires the outside air wet-bulb temperature information detected by the temperature sensor 21. In operation S2, the processor 111 calculates the provided cooling water temperature to be provided by the chiller 12 from the sum of the acquired outside air wet-bulb temperature information and the cooling temperature difference from the outside air wet-bulb temperature by the free cooling (that is, the cooling temperature difference based on the cooling ability of the free cooling unit 121). The cooling temperature difference from the outside air wet-bulb temperature by the free cooling is the temperature difference (for example, 5° C. or more) from the outside air, which may be cooled by the heat discharge only by a free cooling operation by the free cooling unit 121 in the chiller 12, and may be different among each of the chillers 12, for example, each of the free cooling units 121. In operation S3, the processor 111 determines whether or not the provided cooling water temperature calculated in operation S2 is less than a maximum provided cooling water temperature. In a case where the determination result is YES, the process progresses to operation S4. In a case where the determination result is NO, the process progresses to operation S8.

The maximum provided cooling water temperature is a value that results from the subtraction of the sum of a temperature rise in the data center 13 at a time after the air blow (for example, about 2° C. to 5° C.) and a temperature margin (for example, 2° C.) for handling a non-uniform distribution or the like of the temperature due to a structure or the like in the data center 13 from an upper limit of an operation temperature range which is specified by an operation temperature specification of the server 134 in the data center 13 and that depends on the upper limit of the operation temperature range which is specified by the operation temperature specification. The temperature rise at a time after the air blow is a rise of the provided cooling water temperature due to a heat amount remaining after the heat exchange by the air conditioning unit 132 in the data center 13, a temperature rise in a delivery of the cold air in the data center 13, and so forth. Even in a case where the provided cooling water temperature of the cooling water supplied from the chiller 12 to the data center 13 is 18° C., for example, the cold air temperature at an outlet portion of the air conditioning unit 132 is 21° C., for example, and the cold air temperature (or a provided cooling temperature) rises to 22.5° C., for example, due to a temperature rise in the delivery of the cold air in the data center 13. Accordingly, the maximum provided cooling water temperature is a value at which the provided cooling temperature in the data center 13 becomes the upper limit of the operation temperature range which is specified by the operation temperature specification of the server 134.

In operation S4, the processor 111 determines whether or not the provided cooling water temperature calculated in operation S2 is less than a minimum provided cooling water temperature. In a case where the determination result is YES, the process progresses to operation S5. In a case where the determination result is NO, the process progresses to operation S6. The minimum provided cooling water temperature is a value that is decided by an operation lower limit temperature of the free cooling by the free cooling unit 121 of the chiller 12, a lower limit of the operation temperature range which is specified by the operation temperature specification of the server 134 in the data center 13, and so forth and that depends on an operation lower limit temperature of the free cooling (that is, the air blow). In operation S5, the processor 111 sets the minimum provided cooling water temperature for the chiller 12 based on the provided cooling water temperature information, and the process progresses to operation S7. In operation S6, the processor 111 sets the provided cooling water temperature calculated in operation S2 for the chiller 12 by the provided cooling water temperature information. The process progresses to operation S7. In operation S7, the processor 111 sets a mode in which the cooling water is provided by the free cooling operation of the free cooling unit 121.

Expressing the minimum provided cooling water temperature as $T_L$, the provided cooling water temperature set for the chiller 12 as $T_S$, the upper limit of the operation temperature range which is specified by the operation temperature specification of the server 134 as $T_U$, an air blow temperature rise as $T_R$, and the temperature margin as $T_M$, the following relationship holds true.

$$T_L \leq T_S \leq \{T_U - (T_R + T_M)\}$$

In operation S8, the processor 111 acquires the power consumption of the server 134 that is detected by the power sensor 24 (hereinafter referred to as "server power information" also) and the power consumption of the chiller 12 that is detected by the power sensor 22 (hereinafter referred to as "chiller power information" also). In operation S9, the processor 111 sets the provided cooling water temperature, at which the total power information of the power consumption of the servers 134 and the chiller 12 of the data center system 1 becomes the minimum based on the acquired server power information and chiller power information, for the chiller 12 based on the provided cooling water temperature information. In operation S10, the processor 111 sets a mode in which the cooling water is provided by a cooling compressor operation of the cooling compressor 122.

The process progresses to S11 after operation S7 or operation S10. In operation S11, the processor 111 adjusts an operation interval in which the setting process of the cooling water temperature is executed, and the process returns to operation S1.

Figure 4:
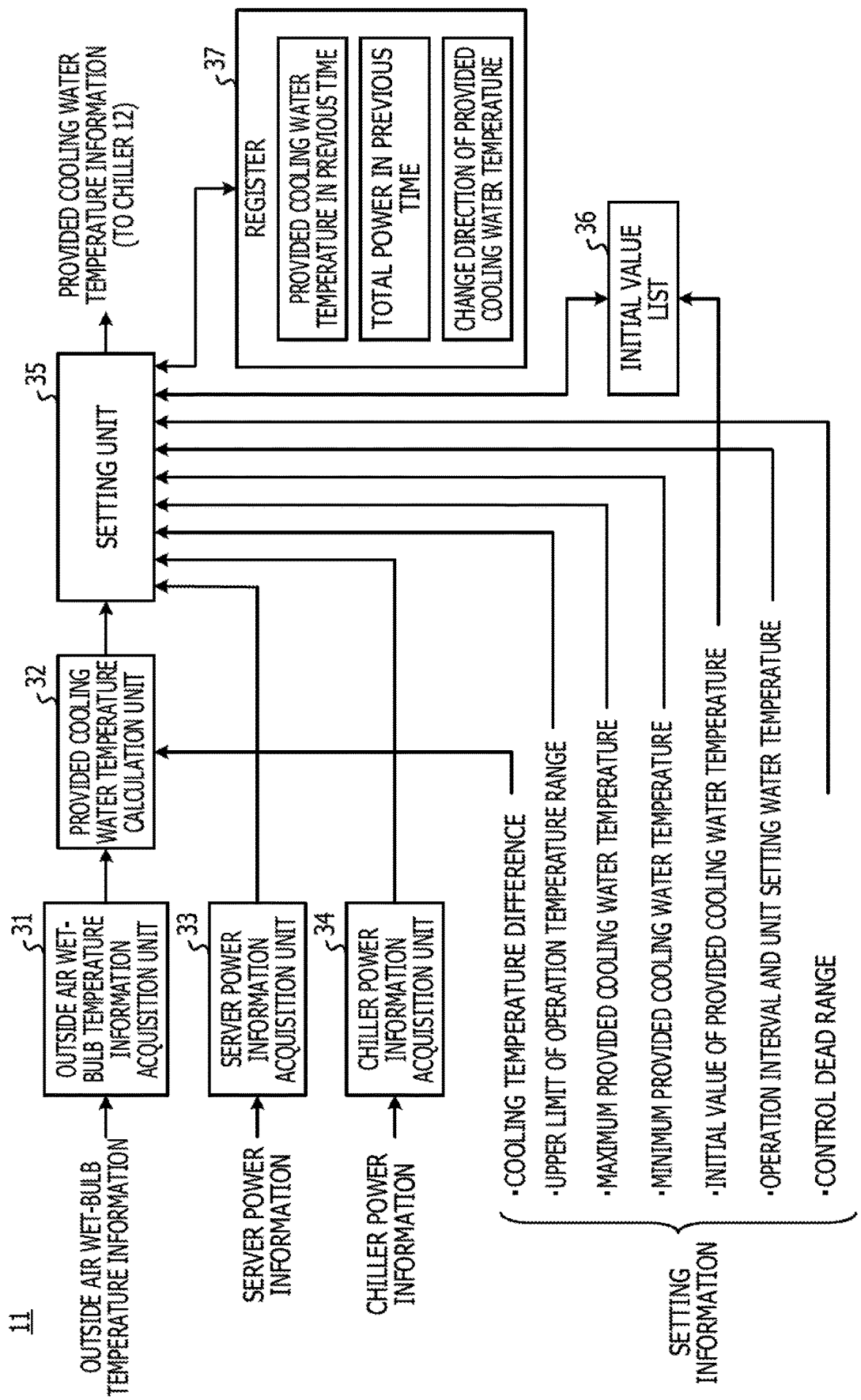
FIG. 4 illustrates one example of a software configuration of the control device.

FIG. 4 illustrates one example of a software configuration of the control device. In FIG. 4, the control device 11 has an outside air wet-bulb temperature information acquisition unit 31, a provided cooling water temperature calculation unit 32, a server power information acquisition unit 33, a chiller power information acquisition unit 34, a setting unit 35, and an initial value list 36, and a register 37. Functions of the outside air wet-bulb temperature information acquisition unit 31, the provided cooling water temperature calculation unit 32, the server power information acquisition unit 33, the chiller power information acquisition unit 34, and the setting unit 35 may be provided by the processor 111. Functions of the initial value list 36 and the register 37 may be provided by the storage device 112.

The outside air wet-bulb temperature information acquisition unit 31 executes operation S1 in which the outside air wet-bulb temperature information detected by the temperature sensor 21 is acquired and supplied to the provided cooling water temperature calculation unit 32. The provided cooling water temperature calculation unit 32 executes operation S2 in which the provided cooling water temperature is calculated from the sum of the outside air wet-bulb temperature information and the cooling temperature difference by the free cooling unit 121 of the chiller 12 which is included in the setting information. The server power information acquisition unit 33 executes a portion of a process of operation S8 in which the server power information detected by the power sensor 24 which is one example of a first sensor is supplied to the setting unit 35. The chiller power information acquisition unit 34 executes a portion of a process of operation S8 in which the chiller power information detected by the power sensor 22 which is one example of a second sensor is supplied to the setting unit 35.

The setting unit 35 is supplied with various kinds of setting information in addition to the server power information and the chiller power information and executes operations S3 to S6 and S9 in which a determination about the provided cooling water temperature is made and the provided cooling water temperature is set. The setting information may include the cooling temperature difference, the upper limit of the operation temperature range which is specified by the operation temperature specification of the server 134, the maximum provided cooling water temperature, the minimum provided cooling water temperature, an initial value of the provided cooling water temperature, the operation interval in which the setting process of the cooling water temperature is executed, a unit setting water temperature which will be described later, a control dead range of a cooling operation of the chiller 12, and so forth, for example.

The maximum provided cooling water temperature is calculated from the upper limit of the operation temperature range. Thus, the maximum provided cooling water temperature may not be included in the setting information and may be calculated by the setting unit 35 based on the upper limit of the operation temperature range. The initial value of the provided cooling water temperature is an initial value of the provided cooling water temperature with respect to the server power in a case where the provided cooling water temperature is the maximum provided cooling water temperature or more. For example, the initial value of the provided cooling water temperature may be retained in the initial value list 36 such that the setting unit 35 is accessible to the initial value.

The register 37 retains data that are used in a case where the setting unit 35 makes a determination about the provided cooling water temperature and sets the provided cooling water temperature. The register 37 may retain the provided cooling water temperature in a previous time that is set in the setting process of the cooling water temperature in the previous time, the total power information in the previous time of the power consumption of the servers 134 and the chiller 12, which is obtained in the setting process of the cooling water temperature in the previous time, change direction information of the provided cooling water temperature which is obtained in the setting process of the cooling water temperature (information such as increasing direction or decreasing direction), and so forth, for example.

In a case where the provided cooling water temperature is the maximum provided cooling water temperature or more, the setting unit 35 executes operation S9 in which the provided cooling water temperature, at which the total power information of the power consumption of the servers 134 and the chiller 12 of the data center system 1 becomes the minimum based on the server power information and chiller power information, is set for the chiller 12 by the provided cooling water temperature information. In a case where the provided cooling water temperature is less than the maximum provided cooling water temperature and less than the minimum provided cooling water temperature, operation S5 may be executed in which the minimum provided cooling water temperature is set for the chiller 12 by the provided cooling water temperature information. In a case where the provided cooling water temperature is equal to or more than the maximum provided cooling water temperature and equal to or more than the minimum provided cooling water temperature, operation S6 may be executed in which the provided cooling water temperature calculated in operation S2 is set for the chiller 12 based on the provided cooling water temperature information.

Figure 5A:
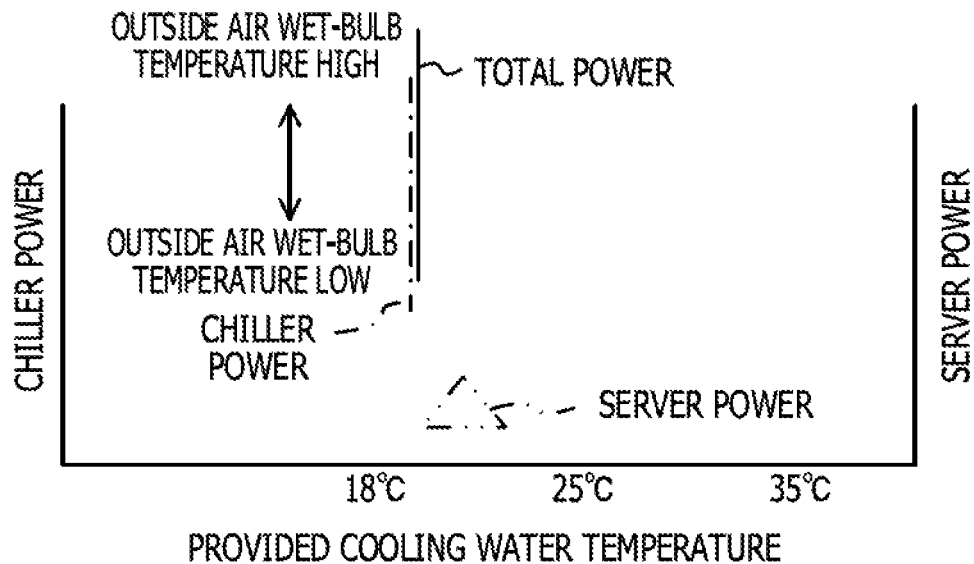
FIGS. 5A and 5B illustrate examples of power consumption of a chiller and a server.
Figure 5B:
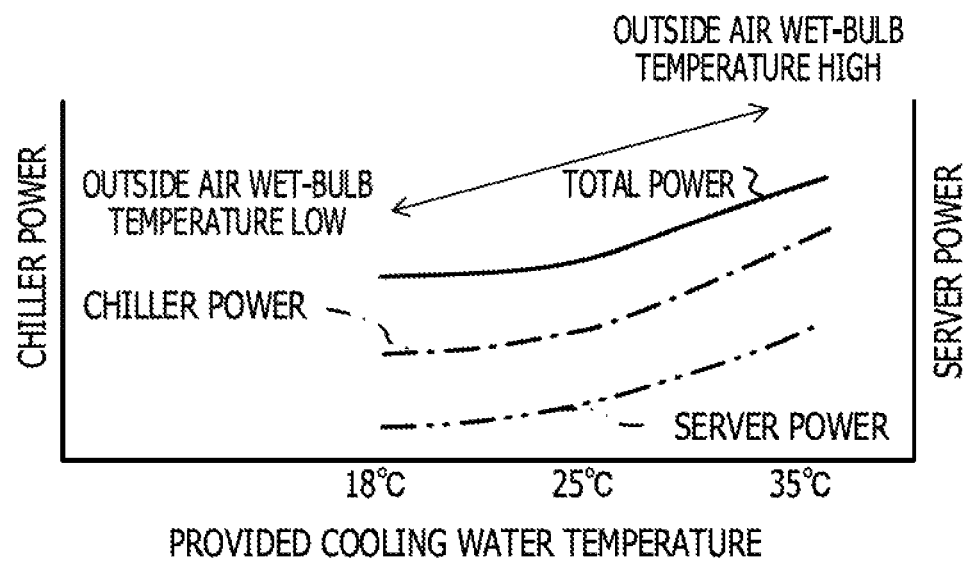

FIGS. 5A and 5B illustrate examples of the power consumption of the chiller and the servers. In FIGS. 5A and 5B, the left vertical axis represents the chiller power by an arbitrary unit, the right vertical axis represents the server power by an arbitrary unit, and the horizontal axis represents the temperature. The one-dot chain line represents the chiller power, the two-dot chain line represents the server power, and the bold solid line represents the total power that is the total of the chiller power and the server power. FIG. 5A illustrates one example of the power consumption in which the cooling water produced by the chiller is continuously maintained at a regular temperature regardless of the operation temperature specification of the server and without taking into account the operation of the chiller that is influenced by the outside air wet-bulb temperature. FIG. 5B illustrates one example of the power consumption of FIGS. 1 to 4.

In FIG. 5A, both of the chiller power and the total power rapidly increase in response to the rise of the outside air wet-bulb temperature. In FIG. 5A, the server power represents the power consumption in a case where the CPUs and so forth in the servers are not operating. The server power is in a substantially regular state because fans and so forth that are provided in the servers are continuously operating even in a case where the CPUs and so forth are not operating.

As illustrated in FIG. 5B, both of the chiller power and the total power gradually increase in response to the rise of the outside air wet-bulb temperature. In FIG. 5B, the server power represents the power consumption in a case where the CPUs and so forth in the servers are not operating. Although the fans and so forth provided in the servers are operating even in a case where the CPUs and so forth are not operating, control for reducing the total power in response to (or in association with) the outside air wet-bulb temperature is performed. Thus, because the operations of the fans and so forth provided in the servers are controlled in response to the outside air wet-bulb temperature, the server power gradually increases in response to the rise of the outside air wet-bulb temperature. Accordingly, in FIG. 5B, a rapid increase of the total power and an augmentation of the total power may be suppressed, and power saving of the whole data center system may thereby be realized.

Figure 6B:
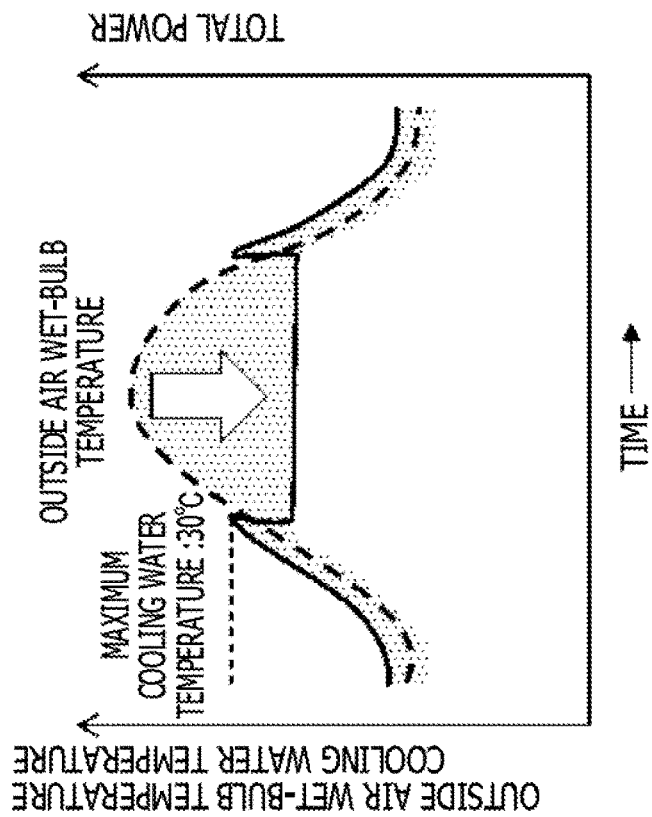
FIGS. 6A and 6B illustrate examples of changes in the power consumption of the data center system.
Figure 6A:
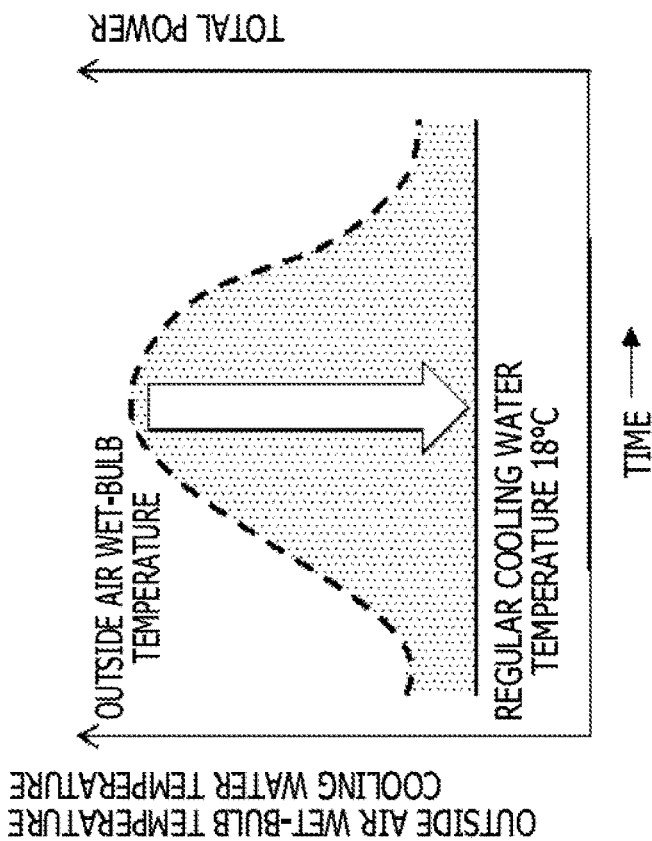

FIGS. 6A and 6B illustrate examples of changes in the power consumption of the data center system. In FIGS. 6A and 6B, the right vertical axis represents the outside air wet-bulb temperature and the cooling water temperature, the left vertical axis represents the total power, and the horizontal axis represents time (for example, one day). The broken line represents the outside air wet-bulb temperature, the solid line represents the cooling water temperature, and the hatching represents the total power. FIG. 6A illustrates one example of the change in the total power in which the cooling water produced by the chiller is continuously maintained at a regular temperature (18° C. in this example) as illustrated in FIG. 5A. FIG. 6B illustrates one example of the change in the total power of FIGS. 1 to 4 in a case where the maximum cooling water temperature is set (30° C. in this example).

In FIG. 6A, the total power is high because the total power increases and decreases in accordance with the change in the outside air wet-bulb temperature in one day. On the other hand, in FIG. 6B, because the total power is reduced in response to the outside air wet-bulb temperature, the increase and decrease in the total power in accordance with the change in the outside air wet-bulb temperature in one day is small, and the total power is low compared to FIG. 6A.

Figure 7A:
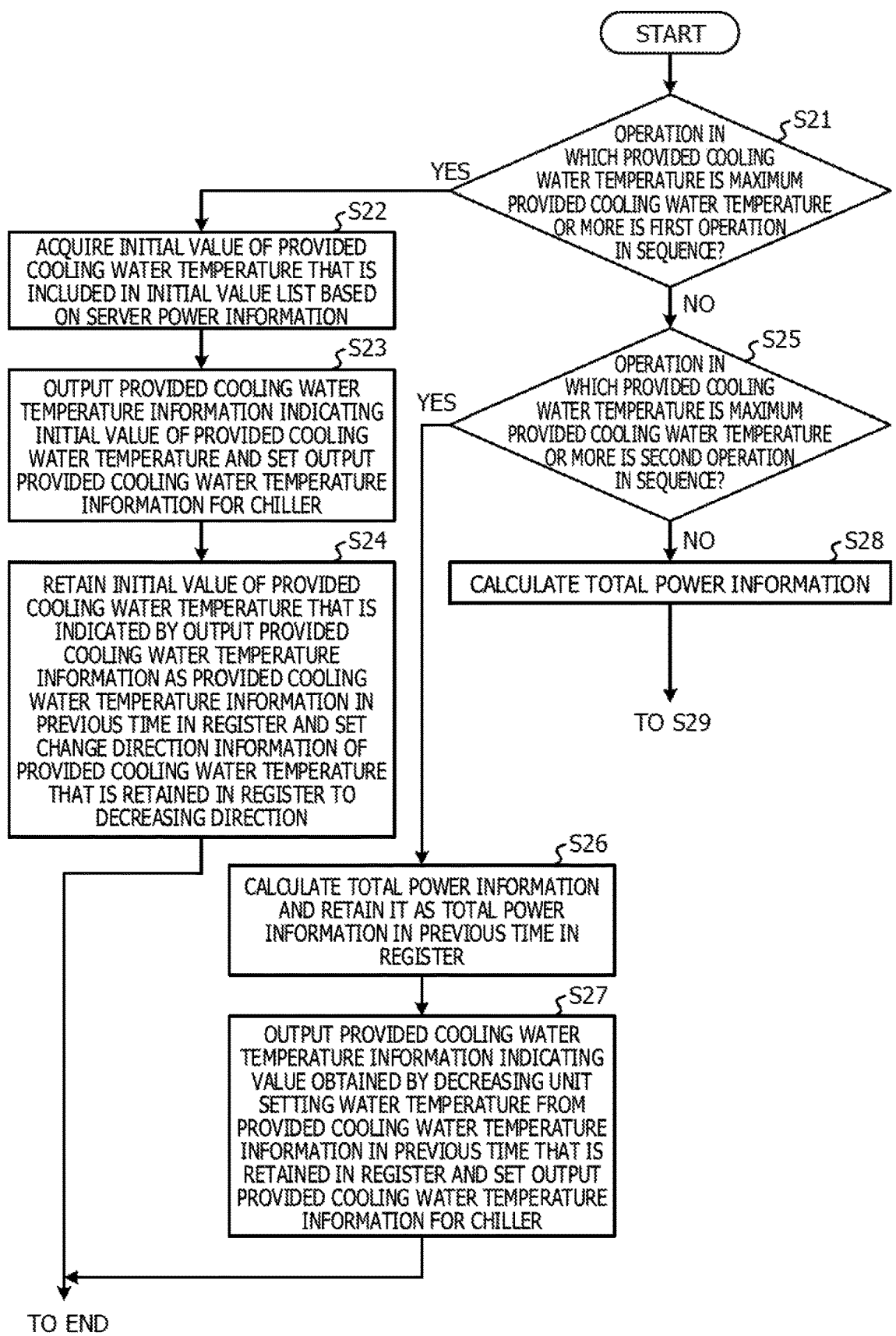
Figure 7B:
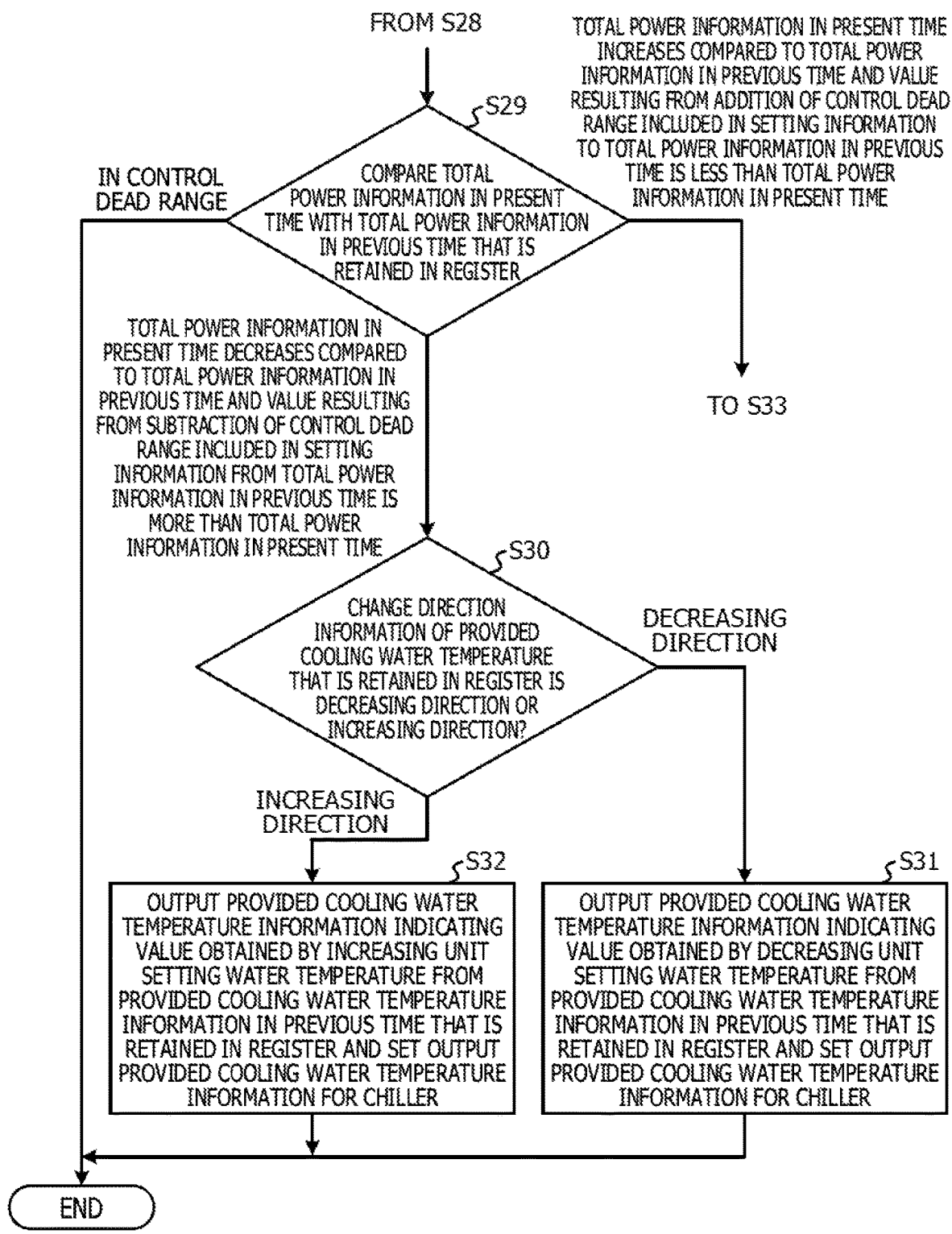

FIGS. 7A to 7C illustrate one example of the setting process of the cooling water temperature. FIGS. 7A to 7C illustrate a more specific setting process than the setting process of the cooling water temperature that is illustrated in FIG. 3. The setting process illustrated in FIGS. 7A to 7C may be executed by the processor 111. For example, in a case where the provided cooling water temperature is the maximum provided cooling water temperature or more, the total power that is the total of the chiller power and the server power is reduced to the minimum. When the setting process of the cooling water temperature is started, in operation S21, the processor 111 determines whether or not the operation, in which the provided cooling water temperature is equal to or more than the maximum provided cooling water temperature depending on the upper limit of the operation temperature range which is specified by the operation temperature specification of the server 134, is the first operation in a sequence. In a case where the determination result is YES, the process progresses to operation S22. In a case where the determination result is NO, the process progresses to operation S25. In operation S22, the processor 111 acquires the initial value of the provided cooling water temperature that is included in the initial value list 36 based on the server power information acquired from the power sensor 24. In operation S23, the processor 111 outputs the provided cooling water temperature information that indicates the initial value of the provided cooling water temperature and sets the output provided cooling water temperature information for the chiller 12. In operation S24, the processor 111 retains the initial value of the provided cooling water temperature that is indicated by the output provided cooling water temperature information as the provided cooling water temperature information in the previous time in the register 37 and sets the change direction information of the provided cooling water temperature that is retained in the register 37 to the decreasing direction. The process finishes. For example, the initial value of the provided cooling water temperature in a case where the server power exceeds 130 kW may be set to 23° C. The initial value of the provided cooling water temperature in a case where the server power is 110 to 130 kW may be set to 25° C. The initial value of the provided cooling water temperature in a case where the server power is less than 110 kW may be set to 27° C.

In operation S25, the processor 111 determines whether or not the operation in which the provided cooling water temperature is the maximum provided cooling water temperature or more is the second operation in the sequence. In a case where the determination result is YES, the process progresses to operation S26. In a case where the determination result is NO, the process progresses to operation S28. In operation S26, the processor 111 calculates the total power information by totaling the chiller power information acquired from the power sensor 22 and the server power information acquired from the power sensor 24 and retains the total power information as the total power information in the previous time in the register 37. In operation S27, the processor 111 outputs the provided cooling water temperature information that indicates the value which is obtained by decreasing the unit setting water temperature included in the setting information from the provided cooling water temperature information in the previous time which is retained in the register 37 and sets the output provided cooling water temperature information for the chiller 12. The process finishes. The unit setting water temperature is a unit (for example, 1° C.) for increasing or decreasing the water temperature and may arbitrarily be set.

In operation S28, the processor 111 calculates the total power information by totaling the chiller power information acquired from the power sensor 22 and the server power information acquired from the power sensor 24. In operation S29, the processor 111 compares the calculated total power information in the present time, for example, with the total power information in the previous time that is retained in the register 37. As a result of the comparison, in a case where the total power information in the present time decreases compared to the total power information in the previous time and where the value that results from the subtraction of the control dead range (for example, 0.5 kW) included in the setting information from the total power information in the previous time is more than the total power information in the present time, the process progresses to operation S30. As a result of the comparison, in a case where the total power information in the present time increases compared to the total power information in the previous time and where the value that results from the addition of the control dead range included in the setting information to the total power information in the previous time is less than the total power information in the present time, the process progresses to operation S33. As a result of the comparison, in a case where the total power information in the present time is in the control dead range, that is, the value that results from the subtraction of the control dead range included in the setting information from the total power information in the previous time is equal to or less than the total power information in the present time and is equal to or less than the value that results from the addition of the control dead range included in the setting information to the total power information in the previous time, the process finishes.

In operation S30, the processor 111 determines whether or not the change direction information of the provided cooling water temperature that is retained in the register 37 is the decreasing direction or the increasing direction. In a case of the decreasing direction, the process progresses to operation S31. In a case of the increasing direction, the process progresses to operation S32. In operation S31, the processor 111 outputs the provided cooling water temperature information that indicates the value which is obtained by decreasing the unit setting water temperature included in the setting information from the provided cooling water temperature information in the previous time which is retained in the register 37 and sets the output provided cooling water temperature information for the chiller 12, and the process finishes. Meanwhile, in operation S32, the processor 111 outputs the provided cooling water temperature information that indicates the value which is obtained by increasing the unit setting water temperature included in the setting information from the provided cooling water temperature information in the previous time which is retained in the register 37 and sets the output provided cooling water temperature information for the chiller 12, and the process finishes.

In operation S33, the processor 111 determines whether or not the change direction information of the provided cooling water temperature that is retained in the register 37 is the decreasing direction or the increasing direction. In a case of the decreasing direction, the process progresses to operation S34. In a case of the increasing direction, the process progresses to operation S36. In operation S34, the processor 111 outputs the provided cooling water temperature information that indicates the value which is obtained by increasing the unit setting water temperature included in the setting information from the provided cooling water temperature information in the previous time which is retained in the register 37 and sets the output provided cooling water temperature information for the chiller 12. In operation S35, the processor 111 sets the change direction information of the provided cooling water temperature that is retained in the register 37 to the increasing direction, and the process finishes. In operation S36, the processor 111 outputs the provided cooling water temperature information that indicates the value which is obtained by decreasing the unit setting water temperature included in the setting information from the provided cooling water temperature information in the previous time which is retained in the register 37 and sets the output provided cooling water temperature information for the chiller 12. In operation S37, the processor 111 sets the change direction information of the provided cooling water temperature that is retained in the register 37 to the decreasing direction, and the process finishes.

As described above, the setting unit 35 determines whether or not the provided cooling water temperature information is less than the maximum provided cooling water temperature. In a case where the provided cooling water temperature information is the maximum provided cooling water temperature or more, the setting unit 35 newly sets the provided cooling water temperature information in which the total power information that is the sum of the chiller power information and the server power information becomes the minimum. In a case where the provided cooling water temperature information is less than the maximum provided cooling water temperature of the server 134, the setting unit 35 determines whether or not the provided cooling water temperature information is less than the minimum provided cooling water temperature of the chiller 12. In a case where the provided cooling water temperature information is less than the minimum provided cooling water temperature, the setting unit 35 newly sets the minimum provided cooling water temperature as the provided cooling water temperature information for the chiller 12.

In FIGS. 7A to 7C, because the control dead range is provided, a control operation in which switching is frequently performed between the free cooling operation and the cooling compressor operation is regulated, and the operation may thereby be stabilized.

FIG. 8 illustrates one example of the total power. FIG. 8 illustrates one example of the total power by the setting process of the cooling water temperature in FIGS. 7A to 7C. In FIG. 8, the left vertical axis represents a provided cooling water temperature setting that is set for the chiller 12 by the provided cooling water temperature information, the right vertical axis represents the total power by an arbitrary unit, and the horizontal axis represents time by an arbitrary unit. In FIG. 8, the provided cooling water temperature setting is represented by the one-dot chain line, the total power is represented by the two-dot chain line, the bold broken line represents the calculated provided cooling water temperature, and the thin broken line represents the maximum provided cooling water temperature. FIG. 8 illustrates a case where the operation interval included in the setting information is 10 minutes, for example, and the unit setting water temperature is 1° C. For example, in FIG. 8, t1 indicates a state where a transition is made from the free cooling operation to the cooling compressor operation, t2 indicates the change in the cooling water temperature that corresponds to the unit setting water temperature, t3 indicates a state where the total power decreases and the provided cooling water temperature is decreased by the unit setting water temperature, and t4 indicates a state where the total power does not change and the provided cooling water temperature is not changed. In FIG. 8, t5 indicates a state where the total power decreases and the provided cooling water temperature is decreased by the unit setting water temperature, t6 indicates a state where the total power increases and the provided cooling water temperature is decreased by the unit setting water temperature, and t7 indicates a state where the cooling water temperature is low, the total power increases, the change direction of the provided cooling water temperature becomes the increasing direction, and the provided cooling water temperature is increased by the unit setting water temperature.

One example of the relationship between the outside air wet-bulb temperature and the provided cooling water temperature setting will be described. For example, the upper limit of the operation temperature range that is specified by the operation temperature specification of the server 134 is 35° C., the temperature rise at a time after the air blow is 3° C., the temperature margin is 2° C., the cooling temperature difference from the outside air wet-bulb temperature by the free cooling is 5° C., the minimum provided cooling water temperature that is the operation lower limit temperature of the free cooling is 10° C., the heat discharge by the free cooling operation is performed in a case where the outside air wet-bulb temperature is 25° C. or less, and the cooling compressor operation is performed in a case where the outside air wet-bulb temperature is 25° C. or more. As illustrated in FIGS. 7A to 7C, in a case where the provided cooling water temperature is the maximum provided cooling water temperature or more, the setting process of the cooling water temperature that reduces the total power which is the total of the chiller power and the server power to the minimum may be performed.

Figure 9:
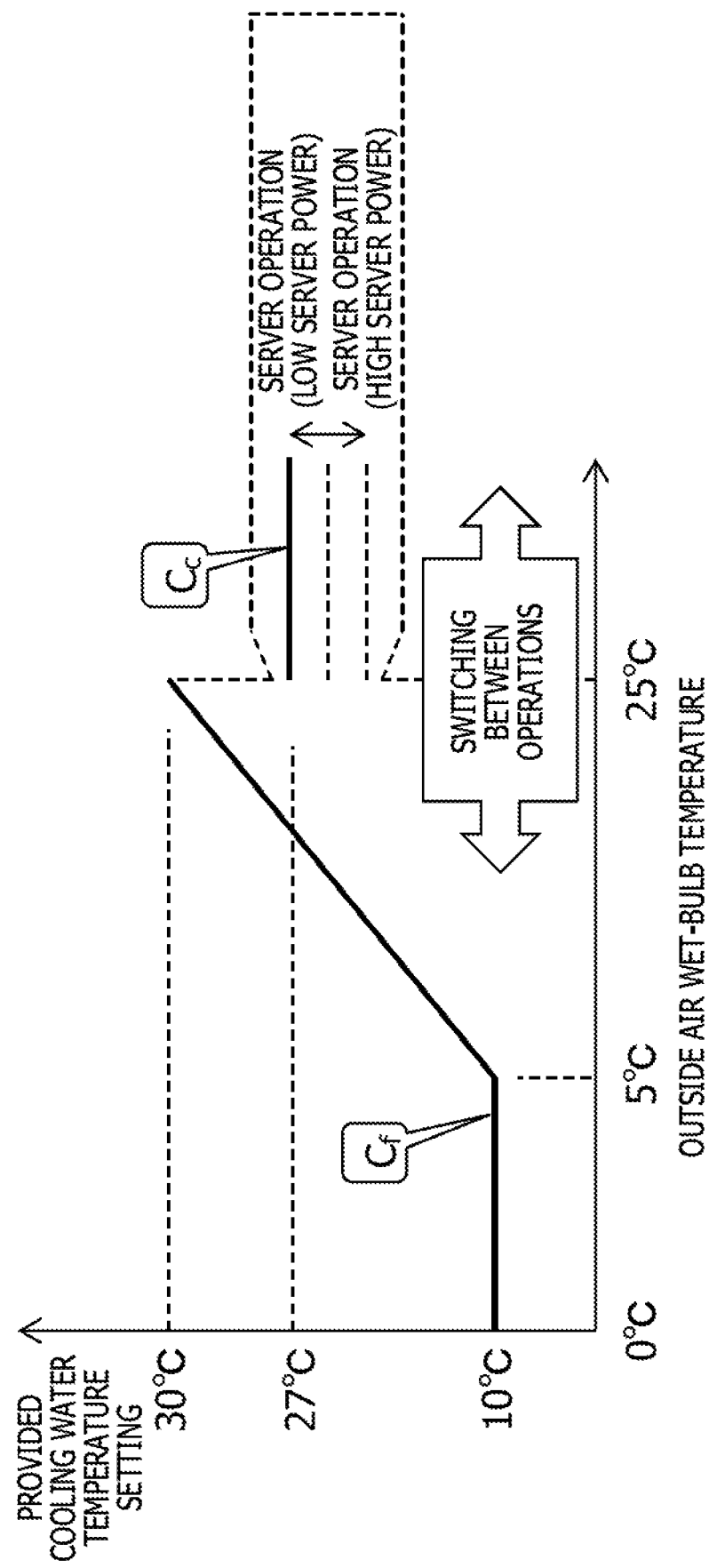
FIG. 9 illustrates one example of setting of the cooling water temperature.

FIG. 9 illustrates one example of setting of the cooling water temperature. FIG. 9 illustrates one example of the setting of the cooling water temperature by the setting process of the cooling water temperature in FIGS. 7A to 7C. In FIG. 9, the vertical axis represents the provided cooling water temperature setting, and the horizontal axis represents the outside air wet-bulb temperature. In the area in which the outside air wet-bulb temperature is 0° C. to 25° C., for example, the heat discharge by the free cooling operation is performed as indicated by $C_f$ in FIG. 9. In the area in which the outside air wet-bulb temperature is 25° C. or more, the heat discharge by the cooling compressor operation is performed as indicated by $C_C$ in FIG. 9. In the area in which the outside air wet-bulb temperature is 25° C. or more, the provided cooling water temperature that provides the minimum total power is set based on the outside air wet-bulb temperature. Thus, in either case where the servers 134 operate with low server power or high server power, the servers 134 may appropriately be cooled, and the power consumption of the data center system 1 may be reduced.

Figure 10:
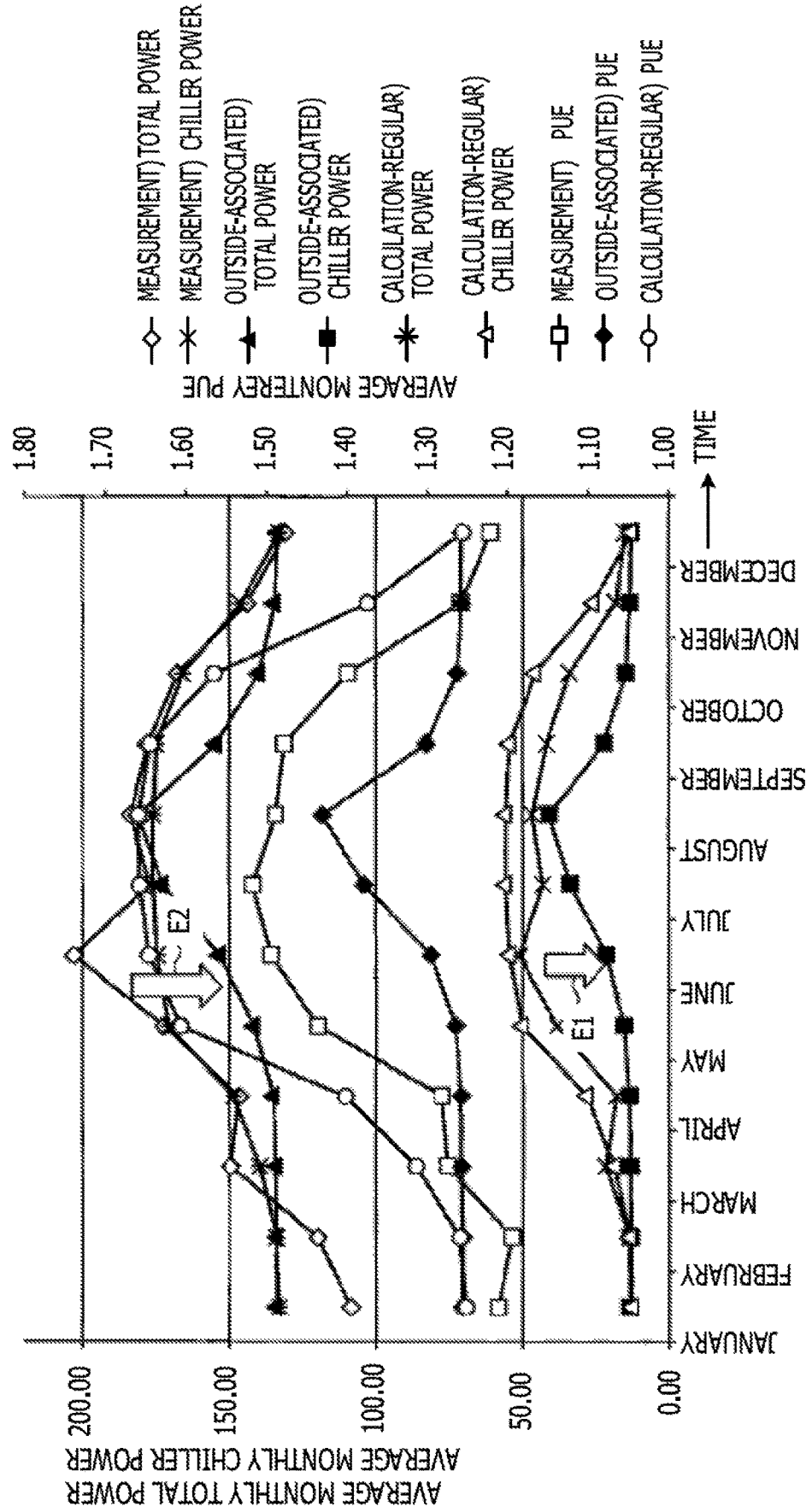
FIG. 10 illustrates examples of measuring results and simulation results.

FIG. 10 illustrates examples of measuring results and simulation results. In FIG. 10, the left vertical axis represents average monthly total power and average monthly chiller power by an arbitrary unit, the right vertical axis represents average monthly power usage effectiveness (PUE), and the horizontal axis represents time. The measuring results represent measurement results of a comparative example in a case where the cooling water produced by the chiller is continuously maintained at a regular temperature (18° C. in this example). The simulation results represent simulation results that are calculated in FIGS. 1 to 4 under the same conditions as the case of FIG. 9. In the notes indicated on the right side of FIG. 10, "MEASUREMENT)" represents the measurement results of the comparative example, and "OUTSIDE-ASSOCIATED)" represents the simulation results of the above embodiment. In FIG. 10, an arrow E1 indicates a lowering effect of the average monthly chiller power that is obtained by reducing the chiller power in response to the outside air wet-bulb temperature. An arrow E2 indicates a lowering effect of the average monthly total power that is obtained by reducing the total power in response to the outside air wet-bulb temperature. From the results indicated in FIG. 10, a configuration illustrated in FIGS. 1 to 4 reduces average annual total power by approximately 7% to approximately 11% and reduces average annual chiller power by approximately 11% to approximately 36%, and improves average annual PUE by approximately 0.1% to approximately 5% compared to the comparative example.

Figure 11:
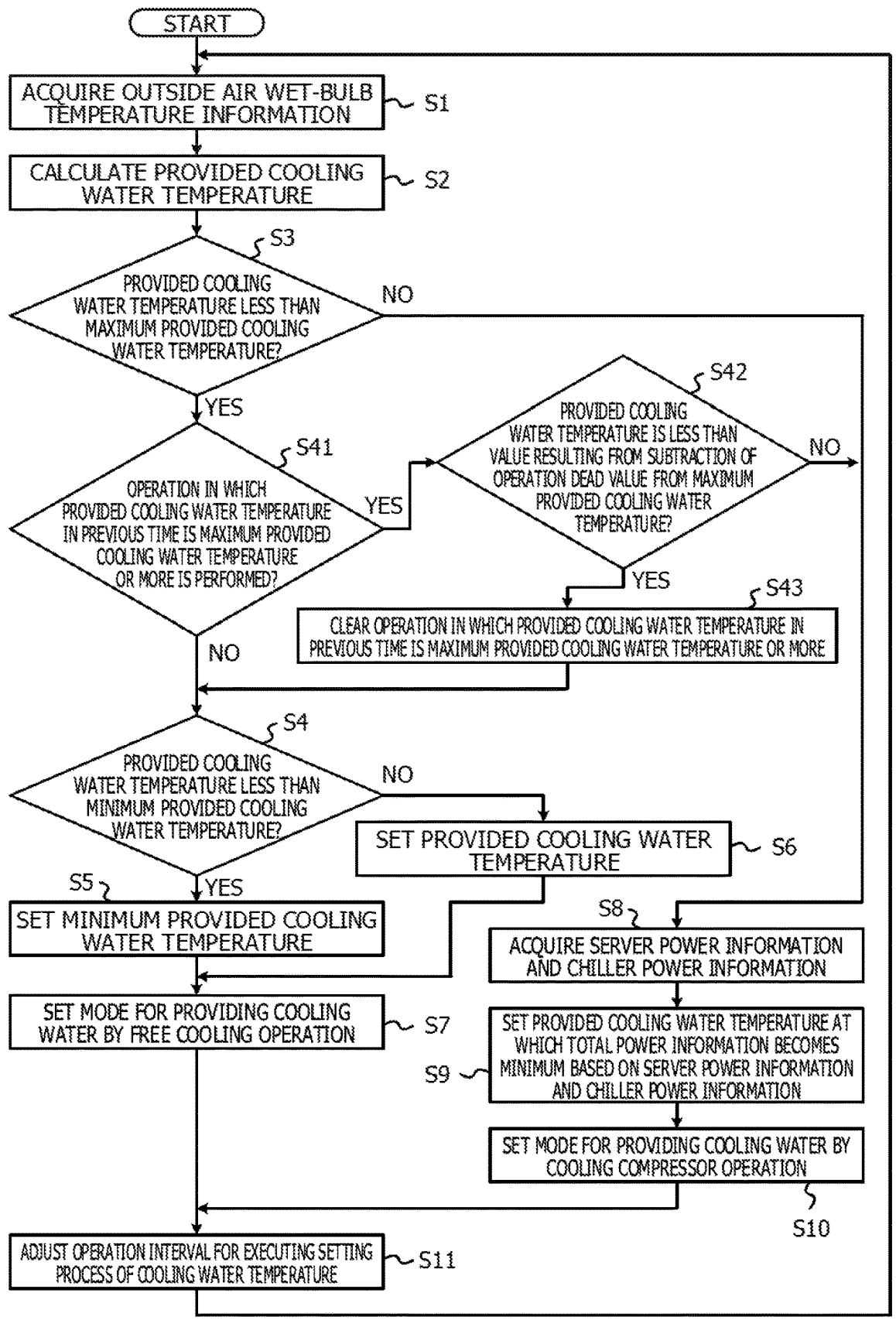
FIG. 11 illustrates one example of the setting process of the cooling water temperature.

FIG. 11 illustrates one example of the setting process of the cooling water temperature. In FIG. 11, the same reference characters will be given to the same operations as FIG. 3, and detailed descriptions thereof may not be made. In FIG. 11, in a case where the determination result in operation S3 is YES, the process progresses to operation S41. In FIG.

11, in operation S41, the processor 111 determines whether or not an operation in which the provided cooling water temperature in the previous time is the maximum provided cooling water temperature or more is performed. In a case where the determination result is YES, the process progresses to operation S42. In a case where the determination result is NO, the process progresses to operation S4. In operation S42, the processor 111 determines whether or not the calculated provided cooling water temperature is less than the value that results from the subtraction of an operation dead value from the maximum provided cooling water temperature. In a case where the determination result is YES, the process progresses to operation S43. In a case where the determination result is NO, the process progresses to operation S8 in order to continue the operation in which the provided cooling water temperature is the maximum provided cooling water temperature or more. In operation S43, the processor 111 clears the operation, in which the provided cooling water temperature in the previous time is the maximum provided cooling water temperature or more and which is retained in a register 37A illustrated in FIG. 12, and the process progresses to operation S4. The operation dead value is a value for determining whether the operation at the maximum provided cooling water temperature or more is continued in a certain range with respect to the provided cooling water temperature that is calculated during the operation at the maximum provided cooling water temperature or more and may be 0.5° C., for example.

In FIG. 11, the operation dead value is provided. Thus, in a case where the operation in which the provided cooling water temperature is the maximum provided cooling water temperature or more is performed, a control operation in which switching is frequently performed between an operation that continues the operation at the maximum provided cooling water temperature or more and an operation that stops continuation is regulated, and the operation may thereby be stabilized.

Figure 12:
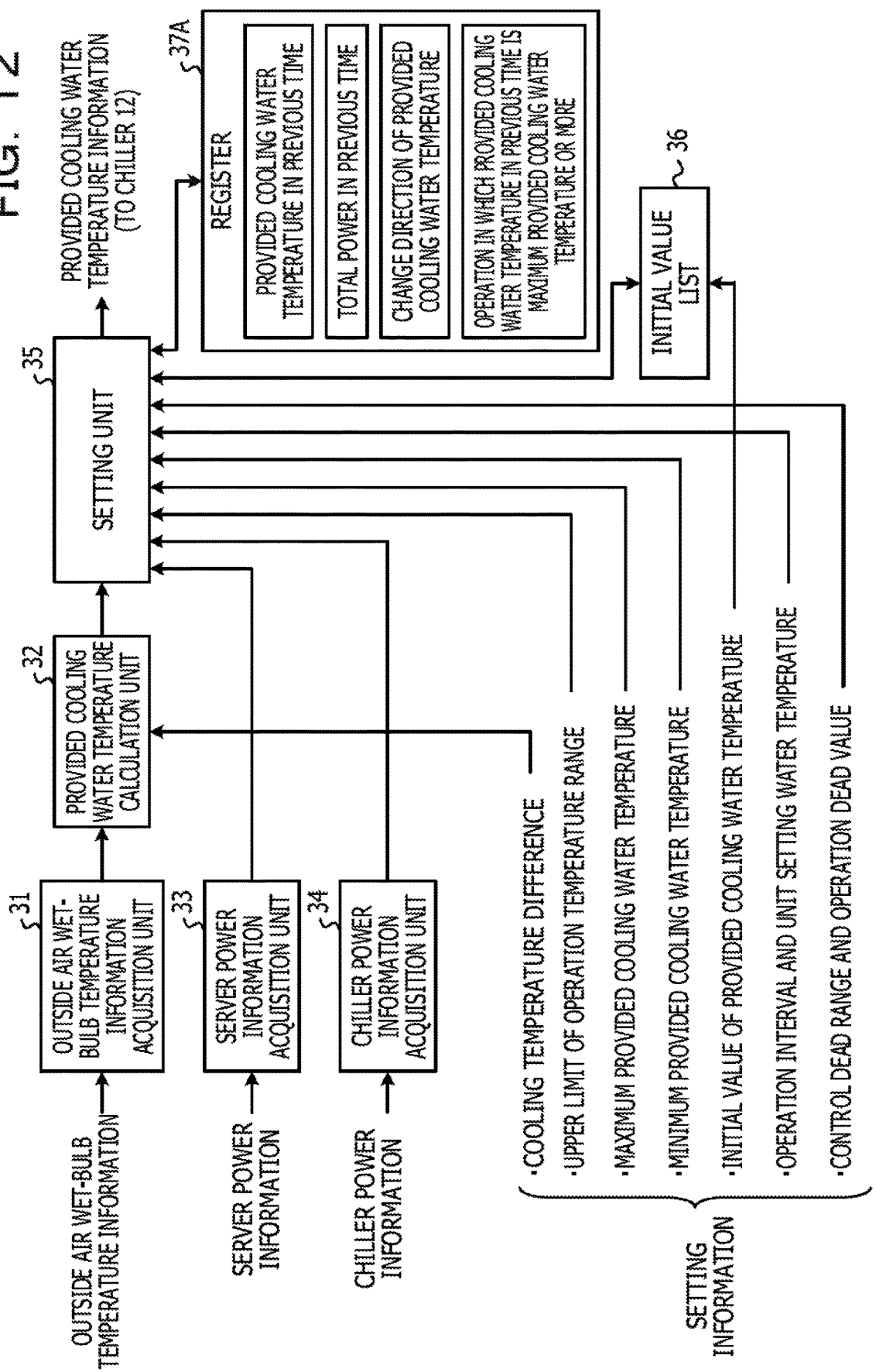
FIG. 12 illustrates one example of a software configuration of the control device.

FIG. 12 illustrates one example of a software configuration of the control device. In FIG. 12, the same reference numerals will be given to the same components as FIG. 4, and detailed descriptions thereof may not be made. A configuration illustrated in FIG. 12 may substantially the same as the software configuration of FIG. 4 except for the point that the above operation dead value is included in the setting information and the register 37A retains the operation in which the provided cooling water temperature in the previous time is the maximum provided cooling water temperature or more.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A data center system comprising:
a data center including an electronic device and an air conditioner configured to cool the electronic device;
a cooling device including a first cooler configured to cool cooling water which is supplied to the data center by an air flow and a second cooler configured to cool the cooling water by heat exchange; and
a control device configured to control the cooling device and including a memory that stores change direction information indicating a direction of changing cooling water temperature information which is set to the cooling device, a control dead range in which an operation of the cooling device is not performed and a unit setting water temperature indicating a unit to increase or decrease the water temperature information, the control device is further configured to:
acquire outside temperature information from a temperature sensor provided outside the data center;
calculate the cooling water temperature information by adding a cooling temperature difference of the first cooler to the outside temperature information;
compare the cooling water temperature information with a maximum cooling water temperature that depends on an upper limit of an operation temperature range of the electronic device;
acquire, when the cooling water temperature information is equal to or larger than the maximum cooling water temperature, first power information of the electronic device from a first power sensor provided in the electronic device and second power information of the cooling device from a second power sensor of the cooling device;
calculate current total power information by adding the first power information and the second power information;
determine whether the change direction information in the memory is a decreasing direction or an increasing direction;
compare the current total power information with previous total power information, which is acquired previously as the current total power information and is stored in the memory, and one of a first value and a second value, respectively, the first value being obtained by subtracting the control dead range in the memory from the previous total power information and the second value being obtained by adding the control dead range in the memory to the previous total power information;
set, when the current total power information is decreased from the previous total power information and the first value is more than the current total power information, the cooling water temperature information to a temperature which is obtained by decreasing the unit setting water temperature from the previous total power information in a case of the decreasing direction and set the cooling water temperature information to a temperature which is obtained by increasing the unit setting water temperature from the previous total power information in a case of the increasing direction; and
set, when the current total power information is increased from the previous total power information and the second value is less than the current total power information, the cooling water temperature information to a temperature which is obtained by increasing the unit setting water temperature from the previous total power information in a case of the decreasing direction and change the change direction information in the memory from the decreasing direction to the increasing direction, and set the cooling water temperature information to a temperature which is obtained by decreasing the unit setting water temperature from the previous total power information in a case of the increasing direction and change the change direction information in the memory from the increasing direction to the decreasing direction.

2. The data center system according to claim 1, wherein the control device is configured to: set, when the cooling water temperature information is less than the maximum cooling water temperature, the cooling device to a second mode in which the cooling water is supplied to the data center by the first cooler.

3. The data center system according to claim 1, wherein the control device is configured to: compare, when the cooling water temperature information is less than the maximum cooling water temperature, the cooling water temperature information with a minimum cooling water temperature that depends on an operation lower limit temperature by the air flow of the cooling device; and set the cooling water temperature information to the cooling device based on a comparison result.

4. The data center system according to claim 3, wherein the control device is configured to set the minimum cooling water temperature to the cooling device as the cooling water temperature information when the cooling water temperature information is less than the minimum cooling water temperature.

5. The data center system according to claim 3, wherein the control device is configured to set the cooling water temperature information to the cooling device when the cooling water temperature information is equal to or larger than the minimum cooling water temperature.

6. The data center system according to claim 1, wherein the maximum cooling water temperature is a value obtained by subtracting a sum of a temperature rise in the data center at a time after the air blow and a temperature margin for handling a non-uniform distribution of temperature due to a structure in the data center from the upper limit of the operation temperature range.

7. The data center system according to claim 3, wherein the minimum cooling water temperature is a value based on the operation lower limit temperature by the air flow and a lower limit of an operation temperature range for the data center.

8. The data center system according to claim 1, wherein the control device is configured to:
   compare, when the cooling water temperature information is less than the maximum cooling water temperature, previous cooling water temperature information which is previously acquired as the cooling water temperature information with the maximum cooling water temperature;
   compare, when the previous cooling water temperature information is not less than the maximum cooling water temperature, the cooling water temperature information with a value which is obtained by subtracting the control dead range from the maximum cooling water temperature; and
   stop the operation when the cooling water temperature information is less than the value.

9. A control method of a data center system, comprising:
   acquiring, by a control device including a memory that stores change direction information indicating a direction of changing cooling water temperature information which is set to a cooling device, a control dead range in which an operation of a cooling device is not performed, a unit setting water temperature indicating a unit to increase or decrease the water temperature information and outside temperature information from a temperature sensor provided outside a data center included in the data center system and including an electronic device which is cooled, the cooling device including a first cooler configured to cool cooling water which is supplied to the data center by an air flow and a second cooler configured to cool the cooling water by heat exchange;
   calculating the cooling water temperature information by adding a cooling temperature difference of the first cooler to the outside temperature information;
   comparing the cooling water temperature information with a maximum cooling water temperature that depends on an upper limit of an operation temperature range of the electronic device;
   acquiring, when the cooling water temperature information is equal to or larger than the maximum cooling water temperature, first power information of the electronic device from a first power sensor provided in the electronic device and second power information of the cooling device from a second power sensor of the cooling device;
   calculating current total power information by adding the first power information and the second power information;
   determining whether the change direction information in the memory is a decreasing direction or an increasing direction;
   comparing the current total power information with previous total power information, which is acquired previously as the current total power information and is stored in the memory, and one of a first value and a second value, respectively, the first value being obtained by subtracting the control dead range in the memory from the previous total power information and the second value being obtained by adding the control dead range in the memory to the previous total power information;
   setting, when the current total power information is decreased from the previous total power information and the first value is more than the current total power information, the cooling water temperature information to a temperature which is obtained by decreasing the unit setting water temperature from the previous total power information in a case of the decreasing direction and setting the cooling water temperature information to a temperature which is obtained by increasing the unit setting water temperature from the previous total power information in a case of the increasing direction; and
   setting, when the current total power information is increased from the previous total power information and the second value is less than the current total power information, the cooling water temperature information to a temperature which is obtained by increasing the unit setting water temperature from the previous total power information in a case of the decreasing direction and changing the change direction information in the memory from the decreasing direction to the increasing direction, and setting the cooling water temperature information to a temperature which is obtained by decreasing the unit setting water temperature from the previous total power information in a case of the increasing direction and changing the change direction information in the memory from the increasing direction to the decreasing direction.

10. The control method according to claim 9, further comprising: setting, when the cooling water temperature information is less than the maximum cooling water temperature, the cooling device to a second mode in which the cooling water is supplied to the data center by the first cooler.

11. The control method according to claim 9, further comprising: comparing, when the cooling water temperature information is less than the maximum cooling water temperature, the cooling water temperature information with a minimum cooling water temperature that depends on an operation lower limit temperature by the air flow of the cooling device; and setting the cooling water temperature information to the cooling device based on a comparison result.

12. The control method according to claim 11, wherein the minimum cooling water temperature is set to the cooling device as the cooling water temperature information when the cooling water temperature information is less than the minimum cooling water temperature.

13. The control method according to claim 11, wherein the cooling water temperature information is set to the cooling device when the cooling water temperature information is equal to or larger than the minimum cooling water temperature.

14. The control method according to claim 9, further comprising:
comparing, when the cooling water temperature information is less than the maximum cooling water temperature, previous cooling water temperature information which is previously acquired as the cooling water temperature information with the maximum cooling water temperature;
comparing, when the previous cooling water temperature information is not less than the maximum cooling water temperature, the cooling water temperature information with a value which is obtained by subtracting the control dead range from the maximum cooling water temperature; and
stopping the operation when the cooling water temperature information is less than the value.

15. A non-transitory computer-readable recording medium recording a control program of a data center system which causes a computer to perform operations, the operations comprising:
acquiring outside temperature information from a temperature sensor provided outside a data center which is included in the data center system, includes an electronic device which is cooled and is controlled based on information, in a memory, including a memory that stores change direction information indicating a direction of changing cooling water temperature information which is set to a cooling device, a control dead range in which an operation of the cooling device is not performed and a unit setting water temperature indicating a unit to increase or decrease the water temperature information, the cooling device including a first cooler configured to cool cooling water which is supplied to the data center by an air flow and a second cooler configured to cool the cooling water by heat exchange;
calculating the cooling water temperature information by adding a cooling temperature difference of the first cooler to the outside temperature information;
comparing the cooling water temperature information with a maximum cooling water temperature that depends on an upper limit of an operation temperature range of the electronic device;
acquiring, when the cooling water temperature information is equal to or larger than the maximum cooling water temperature, first power information of the electronic device from a first power sensor provided in the electronic device and second power information of the cooling device from a second power sensor of the cooling device; calculating current total power information by adding the first power information and the second power information;
determining whether the change direction information in the memory is a decreasing direction or an increasing direction;
comparing the current total power information with previous total power information, which is acquired previously as the current total power information and is stored in the memory, and one of a first value and a second value, respectively, the first value being obtained by subtracting the control dead range in the memory from the previous total power information and the second value being obtained by adding the control dead range in the memory to the previous total power information;
setting, when the current total power information is decreased from the previous total power information and the first value is more than the current total power information, the cooling water temperature information to a temperature which is obtained by decreasing the unit setting water temperature from the previous total power information in a case of the decreasing direction and setting the cooling water temperature information to a temperature which is obtained by increasing the unit setting water temperature from the previous total power information in a case of the increasing direction; and
setting, when the current total power information is increased from the previous total power information and the second value is less than the current total power information, the cooling water temperature information to a temperature which is obtained by increasing the unit setting water temperature from the previous total power information in a case of the decreasing direction and changing the change direction information in the memory from the decreasing direction to the increasing direction, and setting the cooling water temperature information to a temperature which is obtained by decreasing the unit setting water temperature from the previous total power information in a case of the increasing direction and changing the change direction information in the memory from the increasing direction to the decreasing direction.

16. The non-transitory computer-readable recording medium according to claim 15, further comprising:
comparing, when the cooling water temperature information is less than the maximum cooling water temperature, previous cooling water temperature information which is previously acquired as the cooling water temperature information with the maximum cooling water temperature;
comparing, when the previous cooling water temperature information is not less than the maximum cooling water temperature, the cooling water temperature information with a value which is obtained by subtracting the control dead range from the maximum cooling water temperature; and stopping the operation when the cooling water temperature information is less than the value.

\* \* \* \* \*